(12) United States Patent
Yang et al.

(10) Patent No.: US 10,651,279 B2
(45) Date of Patent: May 12, 2020

(54) SEMICONDUCTOR INTERCONNECT STRUCTURE HAVING GRAPHENE-CAPPED METAL INTERCONNECTS

(71) Applicant: Taiwan Semiconductor Manufacturing Co., Ltd., Hsinchu (TW)

(72) Inventors: Shin-Yi Yang, New Taipei (TW); Ching-Fu Yeh, Hsinchu (TW); Ming-Han Lee, Taipei (TW); Shau-Lin Shue, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/227,592

(22) Filed: Dec. 20, 2018

(65) Prior Publication Data

US 2019/0131408 A1 May 2, 2019

Related U.S. Application Data

(62) Division of application No. 15/675,535, filed on Aug. 11, 2017, now Pat. No. 10,164,018.

(60) Provisional application No. 62/512,603, filed on May 30, 2017.

(51) Int. Cl.
| | |
|---|---|
| *H01L 29/16* | (2006.01) |
| *H01L 23/522* | (2006.01) |
| *H01L 21/768* | (2006.01) |
| *H01L 23/532* | (2006.01) |

(52) U.S. Cl.
CPC .... *H01L 29/1606* (2013.01); *H01L 21/76823* (2013.01); *H01L 21/76843* (2013.01); *H01L 21/76864* (2013.01); *H01L 21/76877* (2013.01); *H01L 21/76879* (2013.01); *H01L 21/76883* (2013.01); *H01L 23/5226* (2013.01); *H01L 23/53209* (2013.01); *H01L 23/53223* (2013.01); *H01L 23/53238* (2013.01); *H01L 23/53252* (2013.01); *H01L 23/53266* (2013.01); *H01L 23/53295* (2013.01); *H01L 21/76807* (2013.01); *H01L 23/53214* (2013.01); *H01L 23/53228* (2013.01); *H01L 23/53242* (2013.01); *H01L 23/53257* (2013.01); *H01L 2221/1063* (2013.01)

(58) Field of Classification Search
CPC .................................................. H01L 29/1606
See application file for complete search history.

(56) References Cited

U.S. PATENT DOCUMENTS

| | | | |
|---|---|---|---|
| 8,680,512 B2 * | 3/2014 | Avouris | H01L 29/1606 257/24 |
| 9,793,214 B1 * | 10/2017 | Venugopal | H01L 23/53276 |
| 9,997,604 B2 * | 6/2018 | Lee | H01L 29/417 |

(Continued)

*Primary Examiner* — Thao P Le
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a semiconductor interconnect structure incorporating a graphed barrier layer. The present disclosure provides a method of forming a graphed barrier layer by thermally annealing amorphous carbon layers on metal catalyst surfaces. The thickness of the graphed barrier layers can be selected by varying the thickness of the amorphous carbon layer.

20 Claims, 11 Drawing Sheets

(56) References Cited

U.S. PATENT DOCUMENTS

| | | | |
|---|---|---|---|
| 2009/0257270 A1* | 10/2009 | Schricker | H01L 45/04 365/148 |
| 2009/0283735 A1 | 11/2009 | Li et al. | |
| 2010/0012914 A1 | 1/2010 | Xu et al. | |
| 2010/0258787 A1* | 10/2010 | Chae | H01L 29/0673 257/39 |
| 2011/0193042 A1 | 8/2011 | Maxwell | |
| 2012/0097923 A1* | 4/2012 | Liang | H01L 29/1606 257/27 |
| 2014/0299944 A1* | 10/2014 | Chung | H01L 29/47 257/402 |
| 2015/0249034 A1* | 9/2015 | Kondo | H01L 29/66045 438/151 |
| 2017/0025508 A1* | 1/2017 | Lee | H01L 29/417 |
| 2017/0079138 A1* | 3/2017 | Sakai | G11C 11/00 |
| 2017/0133468 A1* | 5/2017 | Colombo | H01L 29/401 |
| 2017/0338311 A1* | 11/2017 | Lee | H01L 29/1606 |

* cited by examiner

SEMICONDUCTOR INTERCONNECT STRUCTURE HAVING GRAPHENE-CAPPED METAL INTERCONNECTS

This application claims the benefit of U.S. Provisional Patent Application No. 62/512,603, titled "Semiconductor Interconnect Structure Having Graphed-Capped Metal Interconnects," which was filed on May 30, 2017, and U.S. Non-provisional patent application Ser. No. 15/675,535, titled "Semiconductor Interconnect Structure Having Graphed-Capped Metal Interconnects," which was filed on Aug. 11, 2017, and are incorporated herein by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1A:
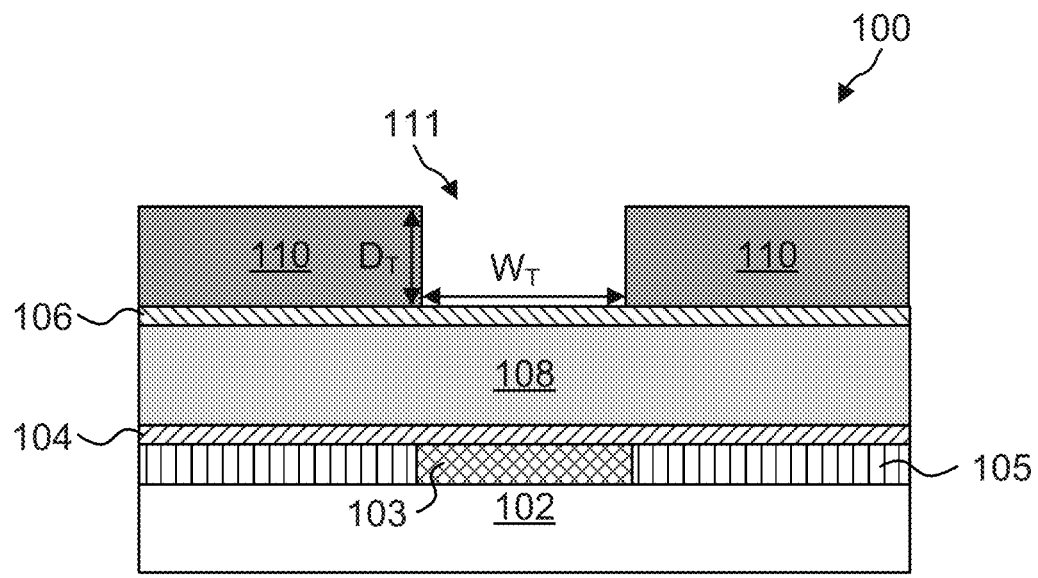
FIGS. 1A-2D are cross-sectional views of a partially-formed semiconductor interconnect structure formed using dual damascene processes, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity varies by ±5% of the value.

The term "about" as used herein indicates the value of a given quantity varies by ±10% of the value.

Semiconductor interconnect fabrication processes between front end of line (FEOL) and back end of line (BEOL) stages of the integrated circuit fabrication process include a metallization process that produces openings in a pre-metal dielectric (PMD) layer (e.g., silicon oxide ($SiO_2$)) and a process to fill these openings with metal (e.g., tungsten (W)). The metallization processes can be accomplished using a damascene process. The damascene process become widely used in integrated circuit manufacturing. The damascene process can involve creating interconnect schemes by cutting trenches into a dielectric and then filling those trenches with metal. Excess metal can be polished away.

Damascene processes can involve creating interconnect structures by cutting trenches and/or vias into a dielectric layer and then filling those trenches and/or vias with conductive material. An example of a damascene process is a dual damascene process, which creates trenches and vias in the dielectric layer and deposits conductive material in both features. The dual damascene process can include multiple patterning and etch steps such as, for example, a first patterning/etch step that forms vias in the dielectric layer so as to provide electrical connection with the underlying metal layer, and a second patterning/etch step to form trenches for the conductive lines. The two patterning/etch steps can be performed in different orders such as, for example, in a (i) trench first then via order; or (ii) a via first then trench order. The dual damascene process can also be a self-aligned dual damascene process using etch stop layers.

Metal such as copper (Cu) can be used in damascene processes as a bulk filling interconnect metal in the trenches and vias because of its low resistance compared to tungsten. However, copper oxidation or diffusion can occur between copper and many common insulating dielectric materials, such as silicon oxide and oxygen containing polymers. For example, copper deposited on an oxide can form copper oxide at or near 200° C. Further, copper can diffuse with a polyimide material during high temperature processing, causing corrosion of the copper and the polyimide material. The corrosion can result in loss of adhesion, delamination, voids, and failure of the device.

To prevent metal diffusion and oxidation, barrier layers can be incorporated into the damascene process using refractory metals. Materials such as titanium nitride (TiN), tantalum nitride (TaN), or other nitride containing refractory metals can be used as barrier layers. In addition, other materials that prevent copper diffusion or oxidation, promote adhesion, and possess appropriate electrical properties can also be used as barrier layers. Barrier layers can be deposited using physical vapor deposition (PVD)-based techniques, which deliver aspect-ratio dependent bottom and sidewall coverage thicknesses. Another example of barrier layer deposition method is an atomic layer deposition (ALD). For example, TaN can be deposited using ALD, delivering a conformal barrier in the contact areas.

As technologies progress, integrated circuits are characterized by decreasing dimension requirements over previous generation devices. As device geometries shrink, dimensions of the metal interconnections are also reduced. The barrier layer thickness can be scaled down in order to reduce the resistance increase associated with the smaller contacting area and to maintain device reliability.

Graphed or graphed-based material provides chemical stability and reliability and can be an effective barrier layer for preventing metal diffusion or oxidation in vias or metal interconnect structures. For example, a graphed-based barrier layer can be used as a suitable barrier layer on the sidewalls or the bottom of the contact opening in the metal interconnects between FEOL and BEOL. Further, minimal body thickness made possible by thin layered graphed-based materials can allow further reduction in device dimension without sacrificing device performance. Therefore, the implementation of suitable graphed-based materials as barrier layers in metal interconnect structures can yield further scaled, high-performance low-power devices adaptable for aggressive (e.g., sub 5 nm) design rules.

Various embodiments in accordance with this disclosure provides mechanisms of forming a graphed barrier layer by thermally annealing amorphous carbon layers on metal catalyst surfaces. To form graphed barrier layers, an amorphous carbon layer can be formed on the exposed surfaces of an opening in the semiconductor structure. A conductive metal layer is deposited in the opening and on the amorphous carbon layer. During an annealing process, carbon atoms in the amorphous carbon layer form carbon clusters at the metal/semiconductor interface through thermal dissociation and surface diffusion. The carbon clusters diffuse and collide at the interface to enable carbon-carbon coupling reactions and form graphed barrier layers. The graphed barrier layers can contain one or more layers of graphed. The thin graphed formation maximizes the volume of the conductive material in the opening. As a result, the conductive metal layer is capped by the graphed barrier layers which avoids diffusion or oxidation of the conductive material and in turn prevents the formation of metal oxide in and around the conductive metal layer in semiconductor interconnect structures.

In accordance with various embodiments of this disclosure, using amorphous carbon layers to form graphed barrier layers in semiconductor interconnect structures provides, among other things, benefits of (i) low sheet resistance by utilizing the thin thickness of graphed layers and maximizing the volume of conductive material in interconnects structure; (ii) enhanced device reliability as graphed-based barrier layers inhibit diffusion and reaction between the layers that are in contact with the barrier layers; (iii) controllable thickness of graphed barrier layer by varying the thickness of the amorphous carbon layer; and (iv) improved device reliability due to chemical stability and reliability of graphed barrier layers.

FIGS. 1A-1D illustrate various views of a partially-formed semiconductor interconnect structure formed using a dual damascene process under a "trench first then via" order, according to some embodiments. More than one pair of via and trench can be formed in the semiconductor interconnect structure.

FIG. 1A is a cross-sectional view of a partially-fabricated semiconductor interconnect structure 100 after the formation of trenches, in accordance with some embodiments of the present disclosure. Partially-fabricated semiconductor interconnect structure 100 can include a substrate 102, a conductive interconnection layer 103, a first etch stop layer 104, a second etch stop layer 106, a first dielectric layer 108, and a second dielectric layer 110. A trench 111 is formed in second dielectric layer 110. In some embodiments, semiconductor interconnect structure 100 can include capping layers, other etch stop layers, other dielectric layers, and/or other suitable materials.

Substrate 102 can be a silicon substrate, according to some embodiments. In some embodiments, substrate 102 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including silicon germanium (SiGe); or (iv) combinations thereof. In some embodiments, substrate 102 can be a semiconductor on insulator (SOI). In some embodiments, substrate 102 can be an epitaxial material.

Conductive interconnection layer 103 can be an active region of a semiconductor device or a conductive layer embedded in substrate 102. In some embodiments, conductive interconnection layer 103 can be embedded in a dielectric structure 105. In some embodiments, conductive interconnection layer 103 can be a metal layer providing electrical connections to integrated circuits and devices. The composition of conductive interconnection layer 103 can include suitable materials such as, for example, silver (Ag), aluminum (Al), gold (Au), Cu, ruthenium (Ru), cobalt (Co), nickel (Ni), W, manganese (Mn), molybdenum (Mo), cobalt tungsten (CoW), cobalt tungsten phosphorous (CoWP), other suitable materials, and/or combinations thereof. In some embodiments, substrate 102 can include a processed integrated circuit wafer containing such as, for example, a plurality of transistors configured to be complementary metal-oxide-semiconductor (CMOS) circuits. These circuits can include logic, analog, radio-frequency (RF) parts made out of a variety of transistors, field-effect transistors (FETs), capacitors, resistors, and interconnections, and are not shown in FIG. 1A for simplicity.

In some embodiments, first etch stop layer 104 is formed on substrate 102 and can be used to prevent the etching of substrate 102 and conductive interconnection layer 103. The composition of first etch stop layer 104 can be silicon nitride. Other exemplary compositions include silicon oxynitride ($SiO_xN_y$), and/or other suitable materials. The deposition of first etch stop layer 104 can be done by any suitable processes such as, for example, chemical vapor deposition (CVD), physical vapor deposition (PVD), atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, other suitable methods, and/or combinations thereof.

In some embodiments, dielectric structure 105 can be made of a low-k dielectric material. In some embodiments, dielectric structure 105 can be formed of any suitable dielectric material such as, for example, silicon oxide ($SiO_x$), organosilicate ($SiO_xC_yH_z$), silicon oxycarbide ($SiO_xC_y$), silicon carbide ($SiC_x$), silicon nitride ($SiN_x$), and/or other suitable dielectric material. The deposition of dielectric structure 105 can be done by any suitable processes such as, for example, CVD, PVD, ALD, MBE, HDPCVD, MOCVD, RPCVD, PECVD, other suitable methods, and/or combinations thereof.

In some embodiments, second etch stop layer 106 is formed on first dielectric layer 108 and can be used to provide an etch stop when forming trench 111 and prevent the etching of first dielectric layer 108. The composition of second etch stop layer 106 can be similar to or different from first etch stop layer 104. For example, second etch stop layer 106 can be silicon nitride, silicon oxynitride, and/or other suitable materials. The deposition of second etch stop layer 106 can be done by any suitable processes such as, for example, CVD, PVD, ALD, MBE, HDPCVD, MOCVD, RPCVD, PECVD, plating, other suitable methods, and/or combinations thereof.

First dielectric layer 108 is made of a dielectric material and can be formed of a low-k dielectric material such as, for example, $SiO_x$, $SiO_xC_yH_z$, $SiO_xC_y$, $SiC_x$, $SiN_x$, and/or other suitable low-k dielectric material. The dielectric value of first dielectric layer 108 can be in a range of about 1 to about 5 (e.g., 1 to 3, or 1 to 4). The deposition of first dielectric layer 108 can be done by any suitable processes such as, for example, CVD, PVD, ALD, MBE, HDPCVD, MOCVD, RPCVD, PECVD, other suitable methods, and/or combinations thereof. In some embodiments, the thickness of first dielectric layer 108 can be in a range of about 50 angstroms to about 2000 angstroms.

Second dielectric layer 110 is made of a dielectric material and can be similar to or different from first dielectric layer 108. For example, second dielectric layer 110 can be formed of silicon oxide, spin-on-glass, silicon nitride, silicon oxynitride, silicon oxycarbide, silicon carbide, FSG, organosilicate, low-k dielectric material, and/or other suitable insulating material. The dielectric value of second dielectric layer 110 can be in a range of about 1 to about 4. Second dielectric layer 110 can be deposited by any suitable processes such as, for example, CVD, PVD, ALD, MBE, HDPCVD, MOCVD, RPCVD, PECVD, other suitable methods, and/or combinations thereof. In some embodiments, the thickness of second dielectric layer 110 can be in a range of about 50 angstroms to about 2000 angstroms.

Trench 111 is an opening that extends vertically through second dielectric layer 110 and can be fabricated using suitable processes including patterning and etching processes. For example, trench 111 can be formed in second dielectric layer 110 using a masking layer that protects regions of second dielectric layer 110 during the etching process. Composition of the masking layer can include a photoresist, a hard mask, and/or other suitable materials. Examples of hard mask can include silicon nitride, silicon oxide, and/or other suitable materials. The patterning process can include forming the masking layer over second dielectric layer 110, exposing the resist to a pattern, performing post-exposure bake processes, and developing the resist to form a masking element consisting of the photoresist. The masking element can then be used to protect regions of second dielectric layer 110 while one or more etching processes forms trenches in second dielectric layer 110. Trenches 111 can be formed using a dry etching process such as, for example, a reactive ion etch (RIE) and/or other suitable processes. In some embodiments, trenches 111 can be formed using a wet chemical etching process. Numerous other methods to form trenches 111 in second dielectric layer 110 may be suitable and one or more etching processes may be needed. The etching process continues until the underlying second etch stop layer 106 is exposed, and second etch stop layer 106 that is formed on first dielectric layer 108 can be used to provide an etch stop for the etching process. In some embodiments, the width $W_T$ of trench 111 can be in a range of about 20 angstroms to about 10000 angstroms.

Figure 1B:
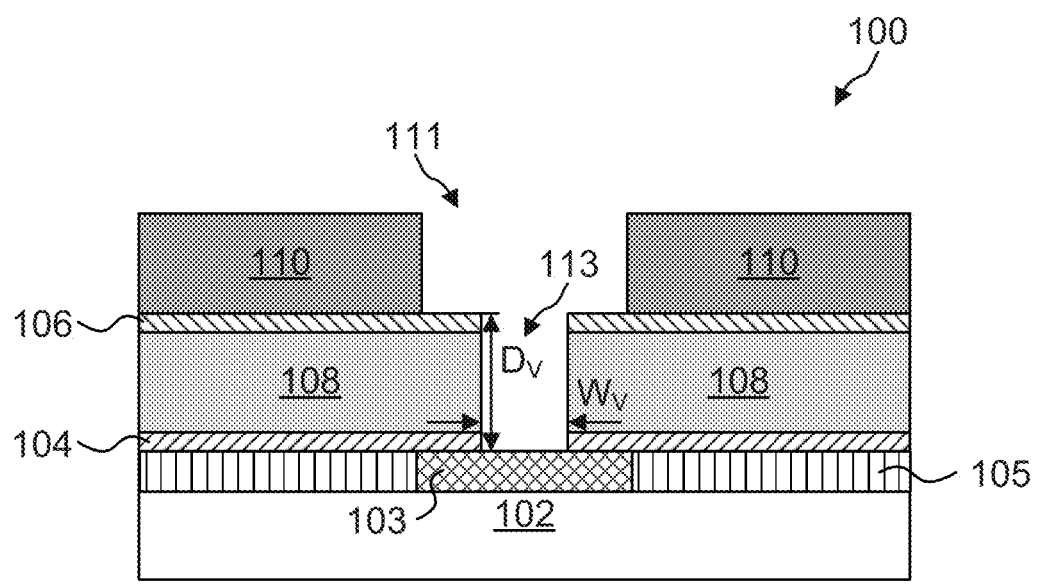

FIG. 1B is a cross-sectional view of a partially-fabricated semiconductor interconnect structure after the formation of vias, in accordance with some embodiments of the present disclosure. Via 113 is an opening under trench 111 and extends vertically through first dielectric layer 108. Via 113 can be fabricated using suitable processes including patterning and etching processes. In some embodiments, via 113 can be formed in portions of first dielectric layer 108 that are exposed by trench 111 using a masking layer that protects regions of first dielectric layer 108 during the etching process. Via 113 can have a lateral dimension that is smaller than that of trench 111. Composition of the masking layer can be similar to the masking layer described above with respect to FIG. 1A. The patterning process can include forming the masking layer over second dielectric layer 110 and second etch stop layer 106, exposing the resist to a pattern, performing post-exposure bake processes, and developing the resist to form a masking element consisting of the photoresist. The masking element can then be used to protect regions of first dielectric layer 108 while one or more etching processes form via 113 in first dielectric layer 108. The etching process can also remove first and second etch stop layer 104 and 106, exposing underlying conductive interconnection layer 103. The etching process can be a dry etching process such as, for example, an RIE and/or other suitable processes. In some embodiments, via 113 can be formed using a wet chemical etching process. Numerous other methods to form via 113 in first dielectric layer 108 may be suitable and one or more etching processes may be needed. The etching process continues until the underlying conductive interconnection layer 103 is exposed. In some embodiments, the width $W_V$ of via 113 can be in a range of about 10 angstroms to about 5000 angstroms.

Figure 1C:
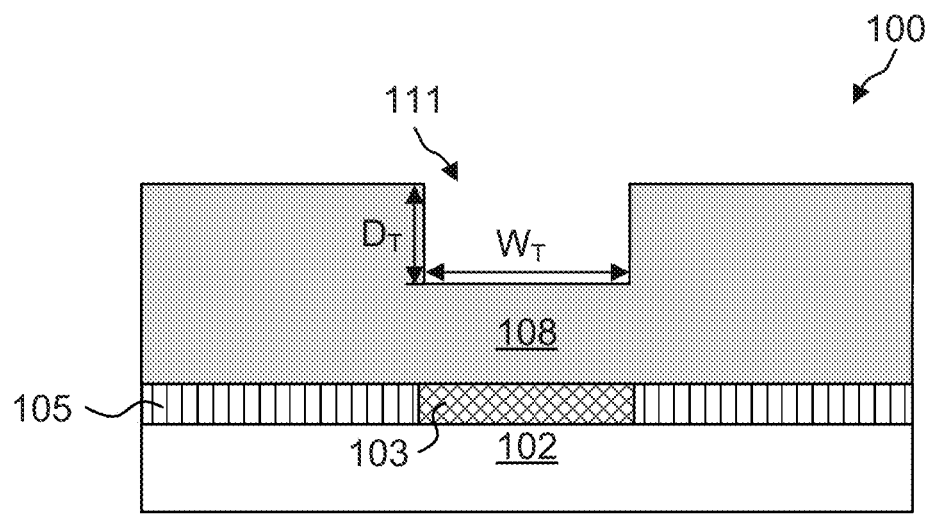
Figure 1D:
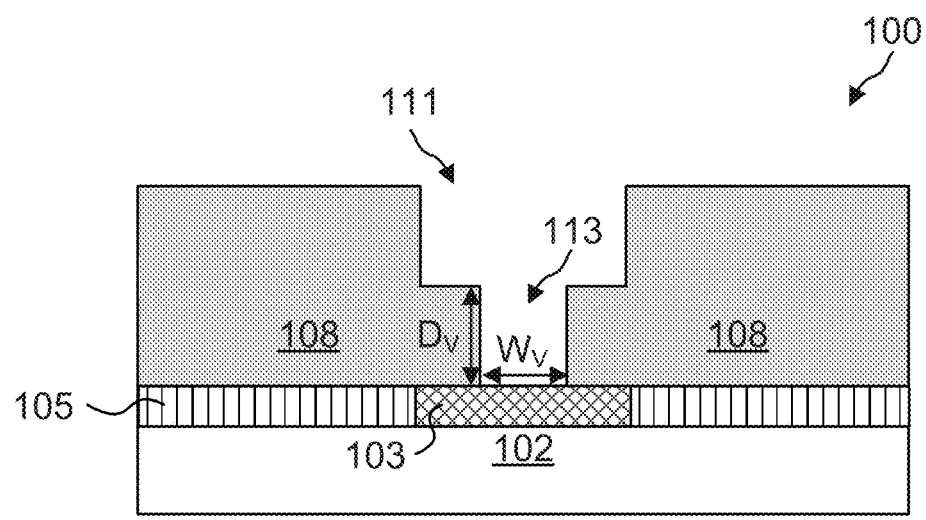

With reference to FIGS. 1C-1D, trenches 111 and vias 113 can be formed in semiconductor interconnect structure 100 without using first and second etch stop layers 104 and 106, in accordance with some embodiments. Further, the composition of respective first and second dielectric layers 108 and 110 can be similar and for simplicity purposes are illustrated as a single first dielectric layer 108, in accordance to some embodiments.

FIG. 1C is a cross-sectional view of a partially-fabricated semiconductor interconnect structure 100 after the formation of trenches, in accordance with some embodiments of the present disclosure. Similar to the semiconductor interconnect structure described with references to FIGS. 1A-1B, first dielectric layer 108 is formed over substrate 102 and conductive interconnection layer 103. First dielectric layer 108 is made of a dielectric material and can be formed of silicon oxide, spin-on-glass, silicon nitride, silicon oxynitride, FSG, a low-k dielectric material, and/or other suitable insulating material. The deposition of first dielectric layer 108 can be done by any suitable processes such as, for example, CVD, PVD, ALD, MBE, HDPCVD, MOCVD, RPCVD, PECVD, other suitable methods, and/or combinations thereof. In some embodiments, the thickness of first dielectric layer 108 can be in a range of about 50 angstroms to about 2000 angstroms.

Trench 111 can be fabricated using suitable processes including patterning and etching processes. For example, trench 111 can be formed in first dielectric layer 108 using a masking layer that protects regions of first dielectric layer 108 during the etching process. Composition of the masking layer can be similar to the masking layer described above with respect to FIG. 1A. The patterning process can include forming the masking layer over first dielectric layer 108, exposing the resist to a pattern, performing post-exposure bake processes, and developing the resist to form a masking element consisting of the photoresist. The masking element can then be used to protect regions of first dielectric layer 108 during the etching process. In some embodiments, the width $W_T$ of trench 111 can be in a range of about 20 angstroms to about 10000 angstroms. Trench 111 can be formed using a dry etching process such as, for example, an RIE process and/or other suitable processes. In some embodiments, trench 111 can be formed using a wet chemical etching process. The etching process continues until a nominal depth of trench 111 has been reached such as, for example, a depth $D_T$ can be in a range of about 50 angstroms to about 2000 angstroms. The depths of trench 111 can be controlled by tuning etching conditions such as, for example, etching time, chamber pressure, gas flow rate, plasma power, voltage biases, and/or other suitable parameters.

FIG. 1D is a cross-sectional view of a partially-fabricated semiconductor interconnect structure 100 after the formation of vias, in accordance with some embodiments of the present disclosure. Via 113 can be fabricated using suitable processes including patterning and etching processes. For example, via 113 can be formed in first dielectric layer 108 using a masking layer that protects regions of first dielectric layer 108 during the etching process. Composition of the masking layer can include a photoresist, a hard mask, and/or other suitable materials. Other exemplary compositions include silicon nitride, silicon oxide, and/or other suitable materials. The patterning process can include forming the masking layer over first dielectric layer 108, exposing the resist to a pattern, performing post-exposure bake processes, and developing the resist to form a masking element consisting of the photoresist. The masking element can then be used to protect regions of first dielectric layer 108 while one or more etching processes form via 113 in first dielectric layer 108. The etching process continues until underlying conductive interconnection layer 103 is exposed. The etching process can be a dry etching process such as, for example, an RIE process and/or other suitable processes. In some embodiments, via 113 can be formed using a wet chemical etching process. In some embodiments, the width $W_V$ of via 113 can be in a range of about 10 angstroms to about 5000 angstroms, and the depth $D_V$ can be in a range of about 50 angstroms to about 2000 angstroms.

FIGS. 2A-2D illustrate various views of a partially-formed semiconductor interconnect structure formed using a dual damascene process under a "via first then trench" order. More than one pair of via and trench can be formed in the semiconductor interconnect structure.

Figure 2A:
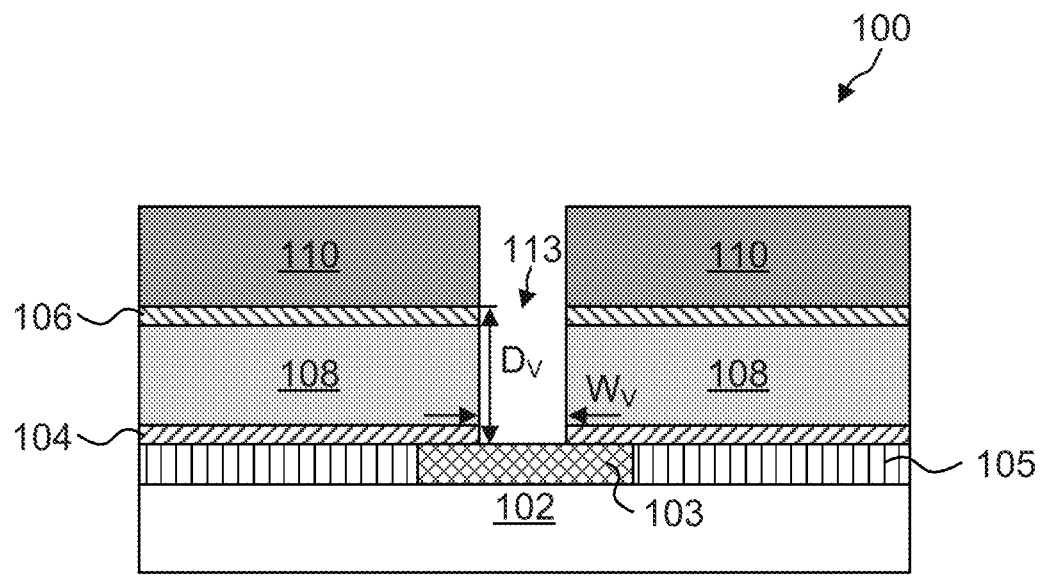

FIG. 2A is a cross-sectional view of a partially-fabricated semiconductor interconnect structure 100 after the formation of trenches, in accordance with some embodiments of the present disclosure. Semiconductor interconnect structure 100 can include substrate 102, conductive interconnection layer 103, first etch stop layer 104, second etch stop layer 106, first dielectric layer 108, and second dielectric layer 110. To form via 113 in first dielectric layer 108, a portion of second dielectric layer 110 would also be removed. In some embodiments, semiconductor interconnect structure 100 can include capping layers, other etch stop layers, other dielectric layers, and/or other suitable materials. Substrate 102, conductive interconnection layer 103, first etch stop layer 104, second etch stop layer 106, first dielectric layer 108, and second dielectric layer 110 are described above with respect to FIGS. 1A-1D.

Via 113 is an opening that extends vertically through first dielectric layer 108 and can fabricated be using suitable processes including patterning and etching processes. Portions of both first and second dielectric layer 108 and 110 will be etched during this process as portions of second dielectric layer 110 need to be removed in order to access first dielectric layer 108. A masking layer is formed over second dielectric layer 110 and patterned to protect regions of second dielectric layer 110 during the etching process, and the pattern can be transferred to first dielectric layer 108 through the etching process. Composition of the masking layer can be similar to the masking layer described above with respect to FIG. 1A. The patterning process can include forming the masking layer over second dielectric layer 110, exposing the resist to a pattern, performing post-exposure bake processes, and developing the resist to form a masking element consisting of the photoresist. The masking element can then be used to protect regions of second dielectric layer 110 while one or more etching processes remove exposed portions of second dielectric layer 110 and form vias in first dielectric layer 108. Via 113 can be formed using a dry etching process such as, for example, an RIE process and/or other suitable processes. In some embodiments, via 113 can be formed using a wet chemical etching process. Numerous other methods to form via 113 in first dielectric layer 108 can be suitable, and one or more etching processes may be needed. The etching process continues until conductive interconnection layer 103 is exposed. During the etching process, first and second etch stop layer 104 and 106 can be removed using suitable processes such as, for example, dry etching, wet chemical etching, and/or other suitable processes. In some embodiments, the width $W_V$ of via 113 can be in a range of about 50 angstroms to about 10000 angstroms.

Figure 2B:
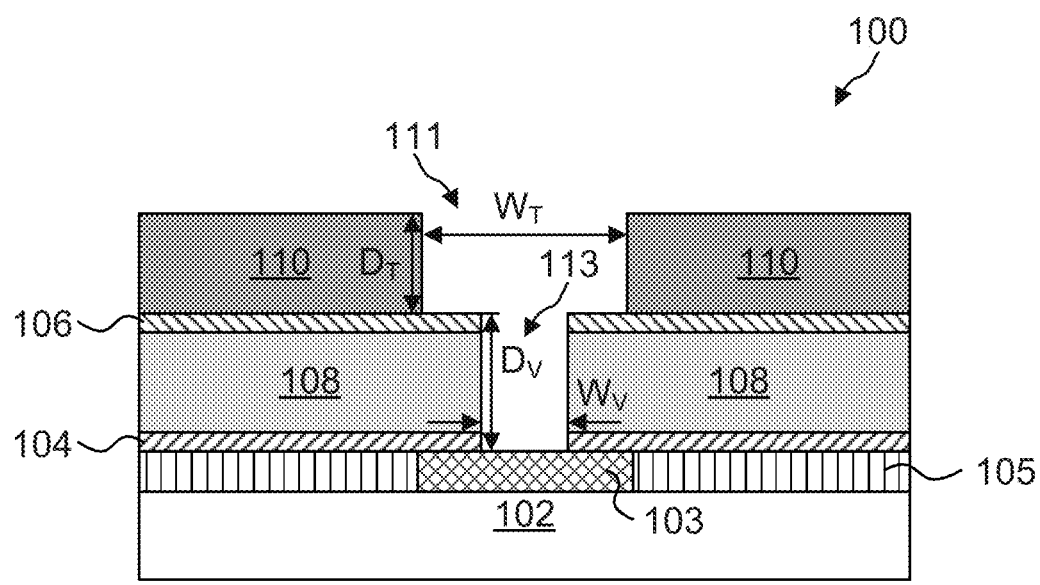

FIG. 2B is a cross-sectional view of a partially-fabricated semiconductor interconnect structure 100 after the formation of trenches, in accordance with some embodiments of the present disclosure. Trench 111 is an opening that extends vertically through second dielectric layer 110. Trench 111 can be formed in second dielectric layer 110 and over via 113 using suitable processes including patterning and etching processes. For example, trench 111 can be formed in second dielectric layer 110 using a masking layer that protects regions of second dielectric layer 110 during the etching process. Composition of the masking layer can be similar to the masking layer described above with respect to FIG. 1A. The patterning process can include forming the masking layer over second etch stop layer 106, exposing the resist to a pattern, performing post-exposure bake processes, and developing the resist to form a masking element consisting of the photoresist. The masking element can then be used to protect regions of first dielectric layer 108 while one or more etching processes form via 113 in first dielectric layer 108. The etching process can also remove first and second etch stop layer 104 and 106, exposing underlying conductive interconnection layer 103. The etching process can be a dry etching process such as, for example, an RIE process and/or other suitable processes. In some embodiments, via 113 can be formed using a wet chemical etching process. Numerous other methods to form via 113 in first dielectric layer 108 may be suitable and one or more etching processes may be needed. The etching process continues until the underlying conductive interconnection layer 103 is exposed. In some embodiments, the width $W_T$ of trench 111 can be in a range of about 50 angstroms to about 10000 angstroms.

Figure 2C:
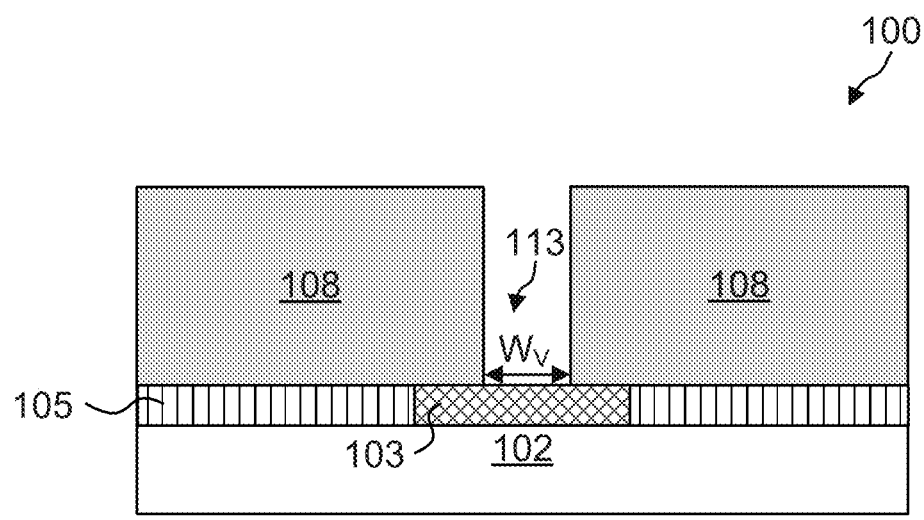
Figure 2D:
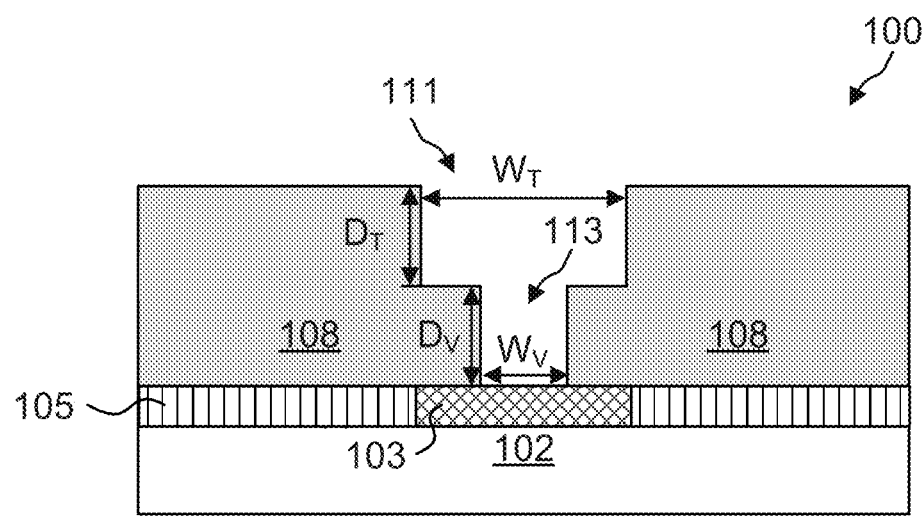

With reference to FIGS. 2C-2D, trenches 111 and vias 113 can be formed in semiconductor interconnect structure 100 without using first and second etch stop layers 104 and 106, in accordance with some embodiments. Further, the composition of respective first and second dielectric layers 108 and 110 can be similar and illustrated as a single first dielectric layer 108 for simplicity, in accordance to some embodiments.

FIG. 2C is a cross-sectional view of a partially-fabricated semiconductor interconnect structure 100 after the formation of trenches, in accordance with some embodiments of the present disclosure. Similar to the semiconductor interconnect structure described with references to FIGS. 2A-2B, first dielectric layer 108 is formed over substrate 102 and conductive interconnection layer 103. Via 113 can be fabricated using suitable processes including patterning and etching processes. For example, via 113 can be formed in first dielectric layer 108 using a masking layer that protects regions of first dielectric layer 108 during the etching process. Composition of the masking layer can include a photoresist, a hard mask, and/or other suitable materials. Other exemplary compositions include silicon nitride, silicon oxide, and/or other suitable materials. The patterning process can include forming the masking layer over first dielectric layer 108, exposing the resist to a pattern, performing post-exposure bake processes, and developing the resist to form a masking element consisting of the photoresist. The masking element can then be used to protect regions of first dielectric layer 108 during the etching process. In some embodiments, the width $W_V$ of via 113 can be in a range of about 20 angstroms to about 5000 angstroms. Via 113 can be formed using a dry etching process such as, for example, an RIE process and/or other suitable processes. In some embodiments, via 113 can be formed using a wet chemical etching process. The etching process continues until conductive interconnection layer 103 is exposed.

FIG. 2D is a cross-sectional view of a partially-fabricated semiconductor interconnect structure 100 after the formation of trenches, in accordance with some embodiments of the present disclosure. Trench 111 can be fabricated using suitable processes including patterning and etching processes. For example, trench 111 can be formed in first dielectric layer 108 and over via 113 using a masking layer that protects regions of first dielectric layer 108 during the etching process. Composition of the masking layer can be similar to the masking layer described above with respect to FIG. 1A. The patterning process can include forming the masking layer over first dielectric layer 108, exposing the resist to a pattern, performing post-exposure bake processes, and developing the resist to form a masking element consisting of the photoresist. The masking element can then be used to protect regions of first dielectric layer 108 while one or more etching processes form trench 111 in first dielectric layer 108. The etching process continues until a nominal depth of trench 111 has been reached such as, for example, a depth $D_T$ can be in a range of about 100 angstroms to about 2000 angstroms. The depth $D_T$ of trench 111 can be controlled by tuning etching conditions such as, for example, etching time, chamber pressure, gas flow rate, plasma power, voltage biases, and/or other suitable parameters. The etching process can be a dry etching process such as, for example, an RIE process and/or other suitable processes. In some embodiments, trench 111 can be formed using a wet chemical etching process. In some embodiments, the width $W_T$ of trench 111 can be in a range of about 100 angstroms to about 10000 angstroms.

Before establishing electrical connection in the partially-fabricated semiconductor interconnect structure described above with references to FIGS. 1B and 1D or FIGS. 2B and 2D, an amorphous carbon layer can be formed prior to the deposition of a conductive material in trench 111 and via 113. In some embodiments, graphed barrier layers with nominal thickness can be formed using an amorphous carbon layer on exposed surfaces of the semiconductor interconnect structures.

Using the structures described above with respect to FIGS. 1B and 1D or FIGS. 2B and 2D, fabrication processes in accordance with embodiments of this disclosure can incorporate graphed barrier layers into semiconductor interconnect structures by thermal annealing amorphous carbon layers formed on metal surfaces. Structures described herein are exemplary, and graphed barrier layers can be incorporated in any suitable semiconductor structures.

FIGS. 3-6 provide various views of a fabrication process of a partially-fabricated semiconductor interconnect structure that illustrate the formation of graphed barrier layers using amorphous carbon layers. The fabrication process provided herein is exemplary, and alternative processes in accordance with this disclosure can be performed that are not shown in these figures. Various features in the figures are not drawn to scale. In fact, the dimensions of these various features are arbitrarily increased or reduced for clarity of illustration and discussion. As discussed above, graphed or graphed-based material provides chemical stability and reliability and can be an effective barrier layer for preventing metal diffusion or oxidation in vias or metal interconnect structures. The minimal body thickness made possible by thin layered graphed-based materials can allow further reduction in device dimension without sacrificing device performance. The implementation of suitable graphed-based materials as barrier layers in metal interconnect structures can yield further scaled, high-performance low-power devices adaptable for aggressive (e.g., 7 nm, 5 nm and beyond) design rules.

Figure 3:
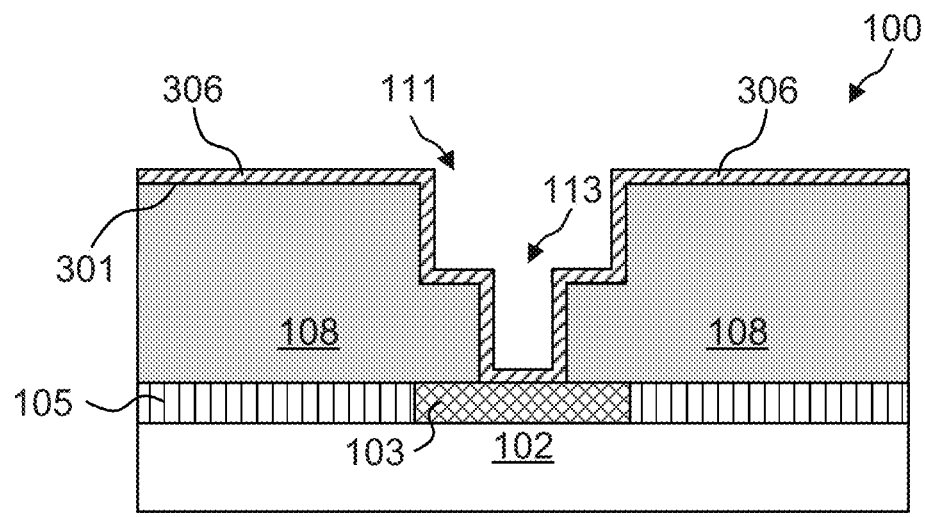
FIG. 3 is a cross-sectional view of a partially-fabricated semiconductor interconnect structure after depositing an amorphous carbon layer, in accordance with some embodiments.

FIG. 3 is a cross-sectional view of a partially-fabricated semiconductor interconnect structure 100 after depositing an amorphous carbon layer, in accordance with some embodiments of the present disclosure. As shown in FIG. 3, an amorphous carbon layer 306 is deposited over exposed surfaces of the partially-fabricated semiconductor structure 100 described with reference to FIGS. 1D and 2D, including exposed surfaces of first dielectric 108 and conductive interconnection layer 103. Amorphous carbon layer 306 can also be deposited over horizontal plane 301 of first dielectric layer 108. Amorphous carbon layer 306 can be deposited using any suitable processes such as, for example, spin-on, CVD, PECVD, ALD, plasma-enhanced ALD (PEALD), and/or other suitable processes. The processing temperature of amorphous carbon layer 306 can be between room temperature and about 1250° C. In some embodiments, depending on the thermal budget of the semiconductor interconnect structure and/or embedded devices, the processing temperature can be between room temperature and about 450° C. A nominal thickness of amorphous carbon layer 306 can be achieved by choosing different deposition parameters such as, for example, deposition time, gas concentration, chamber pressure, and/or other suitable parameters. The nominal thickness of amorphous carbon layer 306 can be in a range of about 1 angstrom to about 300 angstroms.

Figure 4:
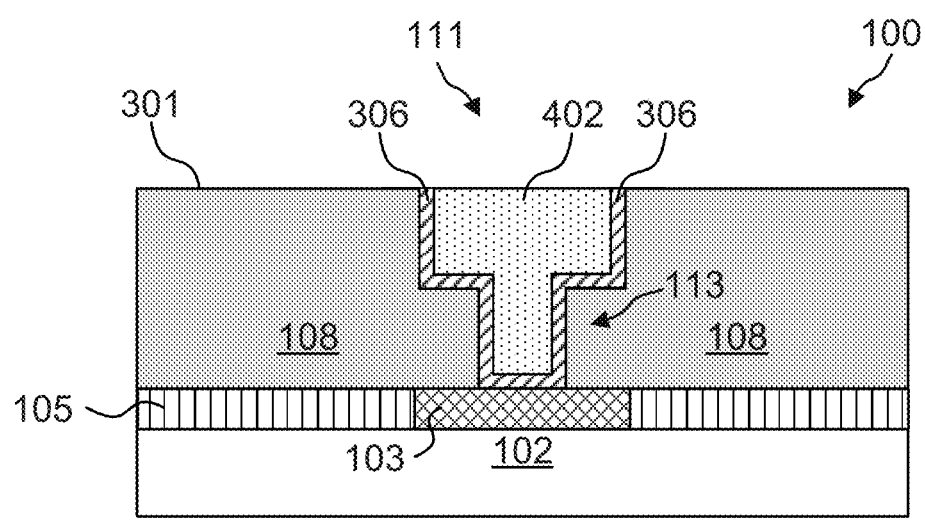
FIG. 4 is a cross-sectional view of a partially-fabricated semiconductor interconnect structure after depositing a conductive layer in trench and via areas, in accordance with some embodiments.

FIG. 4 is a cross-sectional view of a partially-fabricated semiconductor interconnect structure 100 after depositing a conductive layer in the trench and via areas, in accordance with some embodiments of the present disclosure.

As shown in FIG. 4, trench 111 and via 113 are filled with a conductive layer 402. Conductive layer 402 formed in trench 111 can be conductive lines that are electrically coupled to conductive interconnection layer 103. In some embodiments, the composition of conductive layer 402 includes suitable metals such as, for example, iron (Fe), Ag, Al, Au, Cu, Ru, Co, Ni, W, Mn, Mo, CoW, CoWP, other suitable materials, and/or combinations thereof. Conductive layer 402 can be deposited by any suitable filling processes such as, for example, electroless deposition (ELD), Electro-Chemical Plating (ECP), CVD, PVD, ALD, MBE, HDP-CVD, MOCVD, RPCVD, PECVD, other suitable methods, and/or combinations thereof. The processing temperature of conductive layer 402 can be lower than 425° C. and greater than about room temperature. In some embodiments, the filling process can be a bottom up plating process where the conductive layer growth starts at a bottom of via 113 and progresses upwards until trench 111 and via 113 are filled. In some embodiments, conductive layer 402 can be formed using suitable electrochemical plating processes. In some embodiments, the plating process can be an electroless plating process having a chemical bath using formaldehyde or glyoxyic acid as a reduction agent. The bath can also include a copper organic compound solvent. A seed layer having a same or different material as conductive layer 402 can be formed on surfaces of amorphous carbon layer 306 within trench 111 and via 113 prior to the formation of the conductive layer 402. The seed layer can be formed by any suitable processes such as, for example, CVD, PVD, ALD, MBE, HDPCVD, MOCVD, RPCVD, PECVD, other suitable methods, and/or combinations thereof. In some embodiments, there can be an overfill of conductive layer 402 in trench 111 that forms excessive portions of conductive layer 602 above the horizontal plane 301 of first dielectric layer 108.

After depositing conductive layer 402, the top surfaces of semiconductor interconnect structure 100 can be planarized using suitable processes. Excessive portions of amorphous carbon layer 306 and conductive layer 402 that are formed over the horizontal plane 301 of first dielectric layer 108 can be removed using suitable processes such as, dry etching, wet etching, reactive ion etching, and/or other etching methods. Any other suitable methods may alternatively be utilized such as, for example, a chemical mechanical polishing (CMP) process that can also planarize the surfaces of first dielectric layer 108, amorphous carbon layer 306, and conductive layer 402. In some embodiments, a CMP process can be performed to remove the excessive portions of conductive layer 402 followed by an etch process that removes portions of amorphous carbon layer 306.

Figure 5A:
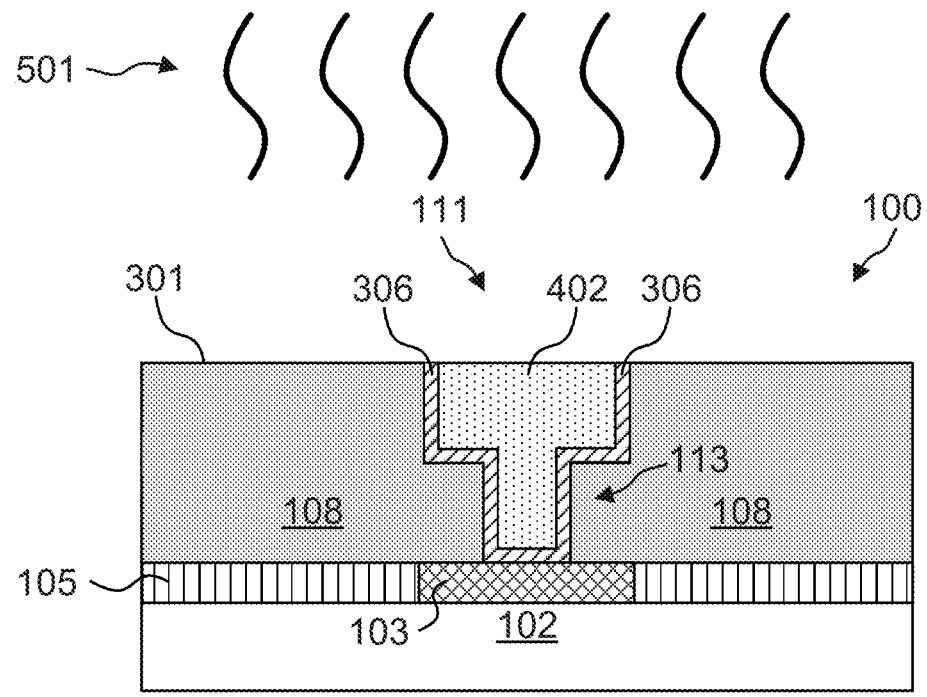
FIGS. 5A-B are respective cross-sectional views of partially-fabricated semiconductor interconnect structures during and after annealing processes, in accordance with some embodiments.
Figure 5A:
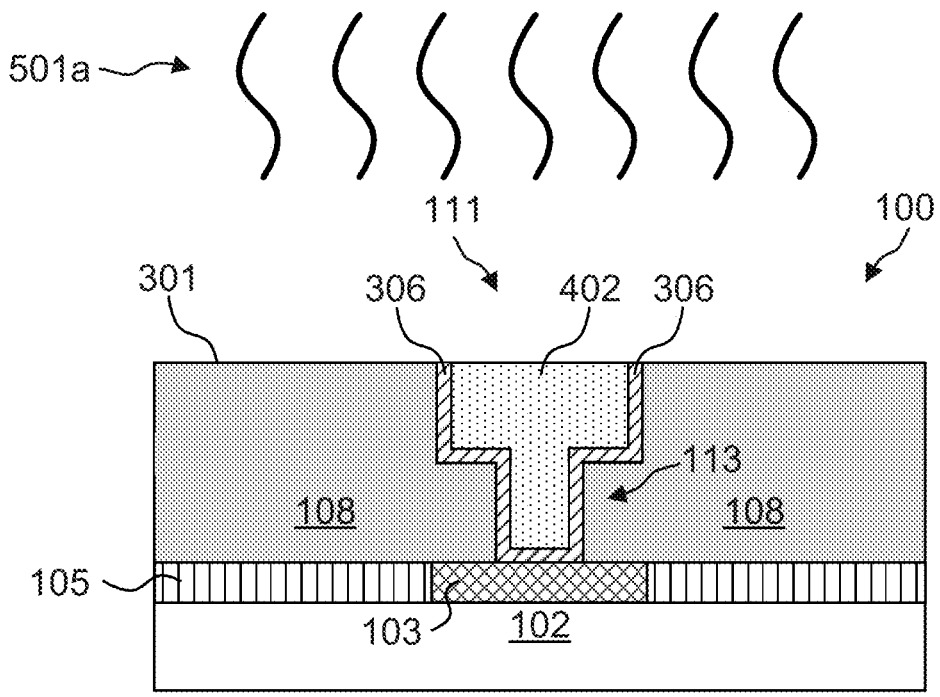
Figure 5A:
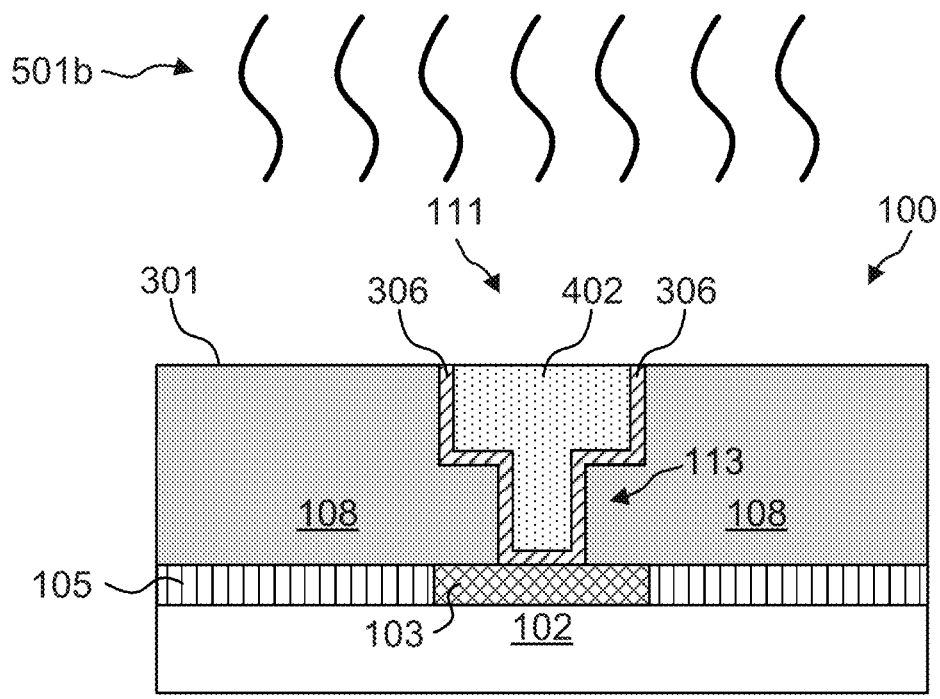
Figure 5A:
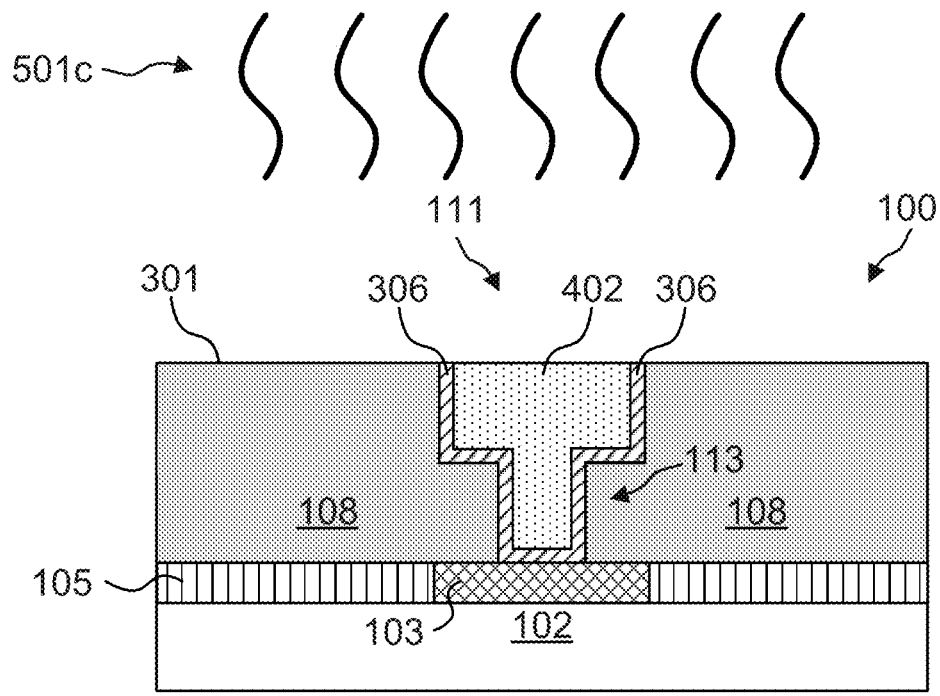
Figure 5B:
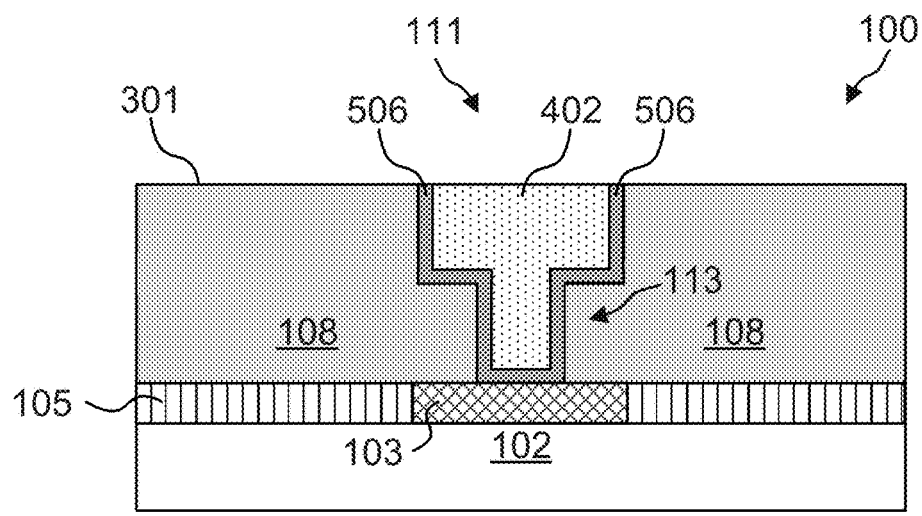

FIGS. 5A-5B are respective cross-sectional views of a partially-fabricated semiconductor interconnect structure 100 during and after an annealing process, in accordance with some embodiments of the present disclosure. In some embodiments, a graphed barrier layer can be formed in the place of a carbon source such as, for example, the amorphous carbon layer.

FIG. 5A shows a cross-sectional view of a partially-fabricated semiconductor interconnect structure 100 during an annealing process 501. The annealing temperature can be in a range of about 200° C. to about 1250° C. In some embodiments, the annealing temperature can be in a range of about 200° C. to about 450° C. The annealing process 501 can be done through multiple annealing steps at various temperatures, in accordance with some embodiments. For example, annealing process 501 can include three annealing steps: 501a-501c. The multiple annealing steps can include annealing steps performed at temperatures of about 200° C., 300° C., 400° C., or any other suitable temperatures. For example, as shown in FIG. 5A(a), a first annealing step 501a can be performed at 200° C. for 300 s. As shown in FIG. 5A(b), a second annealing step 501b can be performed at 300° C. for 300 s. As shown in FIG. 5A(c), a third annealing step 501c can be performed at 400° C. for 60 s. Fewer or more annealing steps can be used. In some embodiments, annealing process 501 can be a multi-step annealing process that includes pre-heating steps, stable heating steps, cooling steps, other suitable steps, and/or combinations thereof. For example, a first annealing step can be a pre-heating step where the semiconductor interconnect structure 100 is heated from room temperature to a stable temperature. The rate of temperature increase can depend on fabrication requirements such as device thermal budget and thermal tolerance. A second annealing step can be a stable heating step which can be performed at about 400° C. for about 600 s. The temperature and time of the stable heating step depends on the thermal energy of inducing a thermal transition of amorphous carbon layer into the graphed barrier layer and can vary depending on the structure of the amorphous carbon layer. A third annealing step can be a cooling step where semiconductor interconnect structure 100 is cooled to a desired temperature such as, for example, room temperature. In some embodiments, annealing process 501 can also be done through a single-step annealing process, in accordance with some embodiments. The temperature for the single-step annealing process can be, for example, 200° C., 300° C., 400° C., or any other suitable temperature, in accordance with some embodiments. In some embodiments, a higher annealing temperature can produce graphed barrier layer with better crystalline quality. Annealing process 501 can be performed for different periods of time such as, for example, in a range of about 30 s to about 300 s, in accordance with some embodiments. For example, each step of the multi-step annealing process can be performed for the same or different amount of time. For example, each annealing step in a three-step anneal process can be performed for about 300 s, 300 s, and 60 s, respectively. The annealing time for a single-step annealing process can be performed for any suitable amount of time such as, for example, 600 s, in accordance with some embodiments. In some embodiments, an annealing time of 30 min can be applied to allow thermal equilibration. Annealing process 501 can include any suitable processes such as, for example, plasma heating, infrared (IR) heating, lamp heating, traditional baking, other suitable annealing methods, and/or combinations thereof.

The metal surfaces of conductive layer 402 in contact with amorphous carbon layer 306 act as catalyst surfaces during annealing process 501 to induce graphitization of the amorphous carbon layers. The graphitization process can include thermal dissociation of the amorphous carbon layer at elevated temperatures which releases carbon atoms. The carbon atoms diffuse into the metal layer and precipitate as carbon clusters during a cool-down process when the solid solubility limit of carbon atoms is reached in the metal surfaces of conductive layer 402. The formed carbon clusters can include, for example, 5-atom or 6-atom carbon clusters and are formed in the place of amorphous carbon layer 306. A dehydrogenation process can also assist in the formation of carbon clusters depending on the existence of catalyst reactants such as hydrogen or oxygen atoms. The carbon clusters can form layers of graphed through carbon-carbon coupling reaction such as, for example, cluster-cluster collisions.

Figure 6:
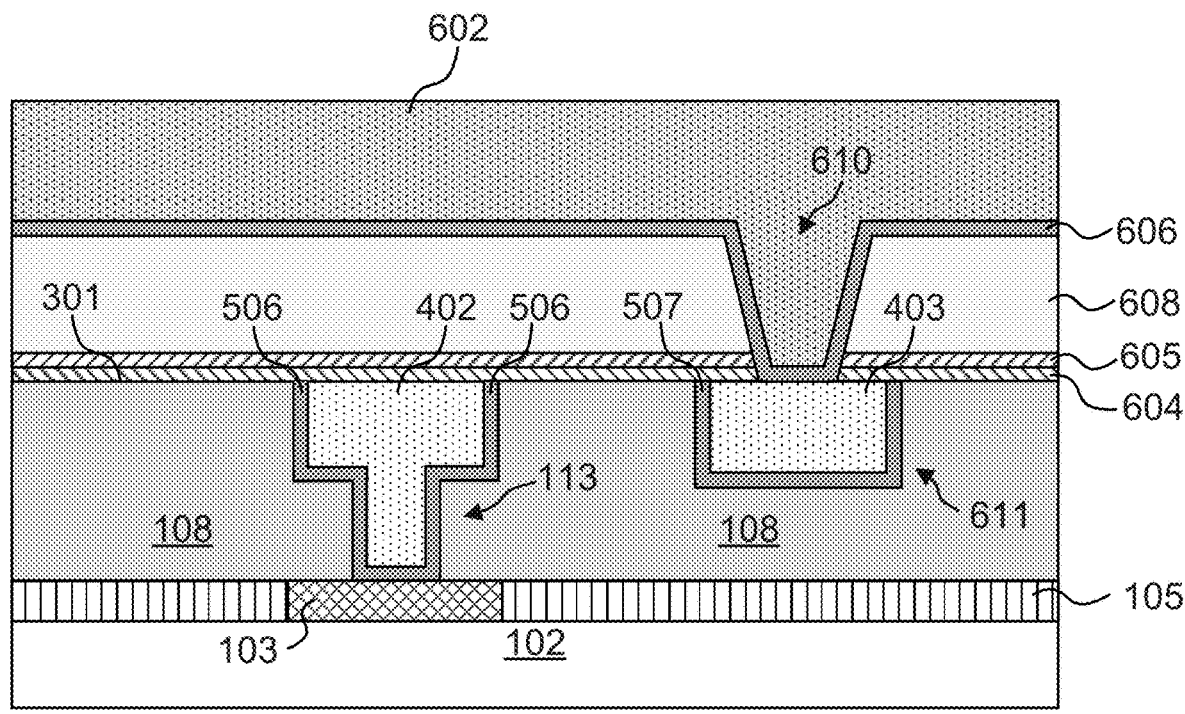
FIG. 6 is a cross-sectional view of partially-fabricated semiconductor interconnect structures illustrating multiple semiconductor layers and interconnect structures, in accordance with some embodiments.

As shown in FIG. 5B, graphed barrier layer 506 is formed in the place of amorphous carbon layer 306 after annealing process 501. The graphed barrier layer can contain one or more layers of graphed. The number of graphed layers or the thickness of the formed graphed barrier layer can be controlled by varying the thickness of the initially deposited amorphous carbon layer. Therefore, a wide range of graphed layer thickness can be achieved. For example, by choosing nominal amorphous carbon layer thicknesses in a range of about 1 angstrom to about 300 angstroms, the graphed layer thicknesses can be in a range of about 1 angstrom to about 300 angstroms. In some embodiments, the graphed barrier layer can have a thickness less than 10 angstroms. In some embodiments, the amorphous carbon layer's thickness can be proportional to the graphed layer's thickness; for example, the thicknesses can be substantially similar. FIG. 6 is a cross-sectional view of partially-fabricated semiconductor interconnect structures illustrating multiple semiconductor layers and interconnect structures, in accordance with some embodiments of the present disclosure. Any suitable structures such as, for example, additional conductive and interconnect structures capped with graphed barrier layers can be incorporated or connected to semiconductor interconnect structure 100 to provide additional electrical connections. For example, a conductive structure 611 that includes a conductive layer 403 and a graphed barrier layer 507 can be formed in first dielectric layer 108. In some embodiments, conductive structure 611 can be conductive lines that are formed using the fabrication processes described with respect to FIGS. 1A-1D and FIGS. 5A-5B. The process to form conductive structure 611 can include forming a trench in first dielectric layer 108, depositing an amorphous carbon layer in the trench, depositing conductive layer 403, and annealing the amorphous carbon layer to form graphed barrier layer 507. Further, respective first and second interlayer etch stops 604 and 605 and an isolation layer 608 can be formed over the horizontal plane 301 of first dielectric layer 108. In some embodiments, second interlayer etch stop 604 is not formed in semiconductor interconnect structure 100. The composition of respective first and second interlayer etch stops 604 and 605 can be similar to or different from respective first and second etch stop layers 104 and 106. For example, one or more etch stop layers 604 can be silicon nitride, silicon oxynitride, and/or other suitable materials. The deposition of respective first and second interlayer etch stops 604 and 605 can be done by any suitable processes such as, for example, CVD, PVD, ALD, MBE, HDPCVD, MOCVD, RPCVD, PECVD, plating, other suitable methods, and/or combinations thereof. Respective first and second interlayer etch stops 604 and 605 can be used to protect first dielectric layer 108 and the structures formed therein from subsequent processing. In some embodiments, the etch stop layers are not needed due to high etch selectivity. In some embodiments, isolation layer 608 can be an inter-layer dielectric (ILD) or inter-metallization dielectric (IMD) layer. The composition of isolation layer 608 can be a dielectric material such as, for example, $SiO_2$, SiN, phosphosilicate glass (PSG), borophosphosilicate glass (BPSG), FSG, silicon oxycarbide ($SiO_xC_y$), Spin-On-Glass, Spin-On-Polymers, silicon carbon material, compounds thereof, composites thereof, combinations thereof, or the like. Isolation layer 608 can be formed by any suitable method known in the art, such as spinning, CVD, PECVD, other suitable methods, and/or combinations thereof.

It should also be noted that isolation layer 608 can include a plurality of dielectric layers embedded with metallic interconnects. In some embodiments, the metallic interconnects are capped with graphed barrier layers formed using the method described with respect to FIGS. 3-5. For example, a second interconnect structure can be formed by opening a via or trench structure 610 in isolation layer 608, depositing an amorphous carbon layer on the exposed surfaces of isolation layer 608, and filling the via or trench structure 610 with conductive layer 602. The via or trench structure 610 can be formed using any suitable process such as, for example, a patterning process, an etching process, and/or combinations thereof. An etching process of isolation layer 608 continues until a portion of the underlying respective first and second interlayer etch stops 604 and 605 are exposed. The exposed portion of respective first and second interlayer etch stops 604 and 605 can be removed during or after forming the via or trench structure 610. An amorphous carbon layer can be deposited on the exposed surfaces of isolation layer 608 using the method similar to the deposition of amorphous carbon layer 306, as described above with respect to FIG. 3. Conductive layer 602 is then deposited over the amorphous carbon layer. In some embodiments, conductive layer 602 is deposited into the via or trench structure 610. In some embodiments, conductive layer 602 is deposited over the horizontal surfaces of the amorphous carbon layer. The composition and deposition of conductive layer 602 can be similar to or different from the composition and deposition of conductive layer 402 as described above with respect to FIG. 4. Using the surfaces of conductive layer 602 as catalyst surfaces, an annealing process can form a graphed barrier layer 606 from the amorphous carbon layer using the method described above with respect to FIGS. 3-5. Therefore, a second interconnect structure can be formed to provide electrical connection between conductive layer 602 and conductive layer 403 of conductive structure 611.

Figure 7:
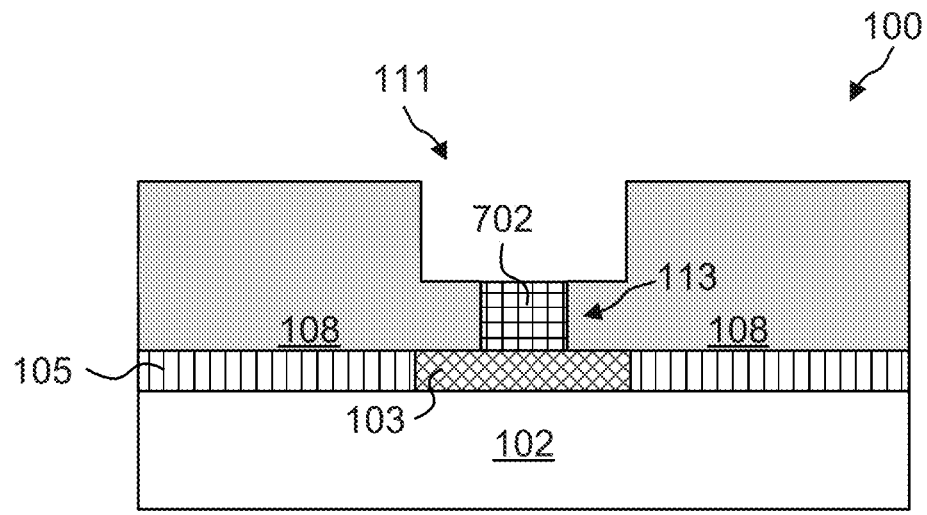
FIG. 7 is a cross-sectional view of a partially-fabricated semiconductor interconnect structure after depositing a pre-fill layer in vias, in accordance with some embodiments.

FIG. 7 is a cross-sectional view of a partially-fabricated semiconductor interconnect structure 100 after depositing a pre-fill layer in vias, in accordance with some embodiments of the present disclosure. The large aspect ratios of vias and trenches in dual damascene metallization processes can cause difficulties during electrochemical plating processes such as, for example, the formation of voids in the trenches or vias. A via pre-fill process can be utilized to reduce voids formed within dual damascene metal layers such as, for example, vias of semiconductor interconnect structures. Prior to forming conductive layers using an electrochemical plating process, a pre-fill layer can be selectively deposited to fill vias, thereby avoiding the formation of voids in vias. Conductive layers are then deposited in the trenches. Therefore, the pre-fill layer and conductive layer can be considered as via-fill and trench-fill layers respectively.

As shown in FIG. 7, a pre-fill layer 702 is deposited to fill via 113 of the partially-fabricated semiconductor interconnect structure 100 as described with respect to FIG. 1D or 2D. The composition of pre-fill layer 702 can include Ag, Au, Cu, Ru, Co, Ni, W, Mn, Mo, other suitable materials, and/or combinations thereof. Pre-fill layer 702 can be formed by any suitable processes such as, for example, ELD, CVD, PVD, ALD, MBE, HDPCVD, MOCVD, RPCVD, PECVD, other suitable methods, and/or combinations thereof. In some embodiments, via 113 and pre-fill layer 702 can be formed by depositing first dielectric layer 108 over dielectric structure 105, opening via 113 in first dielectric layer 108, and depositing pre-fill layer 702. In some embodiments, pre-fill layer 702 can be selectively deposited in via 113 due to incubation on different surfaces. The selectivity can be adjusted through any suitable means such as, for example, surface catalytic reaction, nucleation sites, hydrophilic/hydrophobic properties of surfaces, other suitable factors, and/or combinations thereof. For example, precursors used in ALD or CVD processes for depositing pre-fill layers react with substrate surfaces through chemical reactions, and different chemical reactions can result in different deposit rates. In some embodiments, catalytic effects on metal surfaces can increase the precursor deposition rate on metal surfaces, while hydrophobic surfaces can inhibit precursor deposition. In another example, chemical functional groups of the precursors have different nucleation between surfaces, resulting in growth selectivity. Therefore, pre-fill layer 702 can be selectively deposited at least in a portion of via 113 in a bottom-up fashion by first forming on the exposed metal surfaces of conductive interconnection layer 103. In some embodiments, the top surface of pre-fill layer 702 can be higher or lower than the interface between via 113 and trench 111. For example, there can be an overfill of pre-fill layer 702 in via 113 that forms portions of pre-fill layer 702 in trench 111. In some embodiments, pre-fill layer 702 is deposited until its top surface is coplanar with the interface between via 113 and trench 111. The depth of pre-fill layer 702 can be controlled by a timed deposition process where a longer deposition time can result in a greater depth of deposited material. In some embodiments, chemical additives can be added during the deposition process to further control the deposition rate and the depth of the deposited material.

Figure 8:
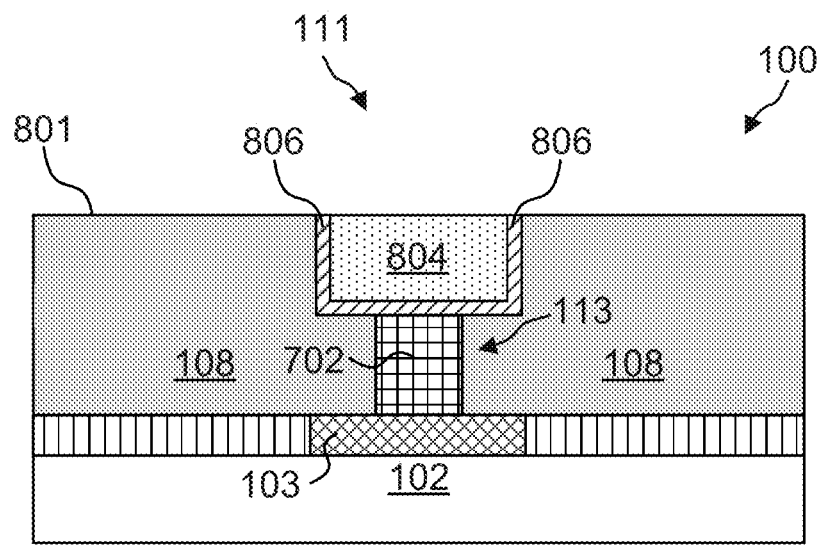
FIG. 8 is a cross-sectional view of a partially-fabricated semiconductor interconnect structure after depositing an amorphous carbon layer and a conductive layer in trenches, in accordance with some embodiments.

FIG. 8 is a cross-sectional view of a partially-fabricated semiconductor interconnect structure 100 after depositing an amorphous carbon layer and a conductive layer in trenches, in accordance with some embodiments of the present disclosure. As shown in FIG. 8, an amorphous carbon layer 806 is deposited over the top surface of pre-fill layer 702 and exposed surfaces of first dielectric layer 108 in trench 111. Similar to the amorphous carbon layer 306 described above with respect to FIG. 3, amorphous layer 806 can be deposited using similar deposition processes such as, for example, spin-on, CVD, PECVD, ALD, PEALD, and/or other suitable processes. A nominal thickness of amorphous carbon layer 806 can be achieved by choosing different deposition parameters and can be in a range of about 1 angstrom to about 300 angstroms. In some embodiments, amorphous carbon layer 806 can be deposited on the top horizontal surfaces of first dielectric layer 108. Amorphous carbon layer 806 can also be deposited in via 113 before the deposition of pre-fill layer 702, in accordance with some embodiments.

A conductive layer 804 is then deposited over amorphous carbon layer 806 to fill trench 111. Pre-fill layer 702 and conductive layer 804 can be same or different materials. For example, compositions of pre-fill layer 702 and conductive layer 804 can both include copper, or their composition can include Ag, Al, Au, Cu, Ru, Co, Ni, W, Mn, Mo, CoW, CoWP, iridium (Ir), Osmium (Os), other suitable materials, and/or combinations thereof. In some embodiments, conductive layer 804 can be formed using deposition methods similar to the deposition of conductive layer 402 as described above with respect to FIG. 4. In some embodiments, there can be an overfill of conductive layer 804 in trench 111 that forms excessive portions of conductive layer 804 above the horizontal plane 801 of first dielectric layer 108.

After depositing conductive layer 804, the top surfaces of semiconductor interconnect structure 100 can be planarized using suitable processes. Excessive portions of conductive layer 804 and amorphous carbon layer 806 that are formed over the horizontal plane 801 of first dielectric layer 108 can be removed using suitable processes such as, dry etching, wet etching, reactive ion etching, and/or other etching methods. Any other suitable methods may alternatively be utilized such as, for example, a CMP process.

Figure 9:
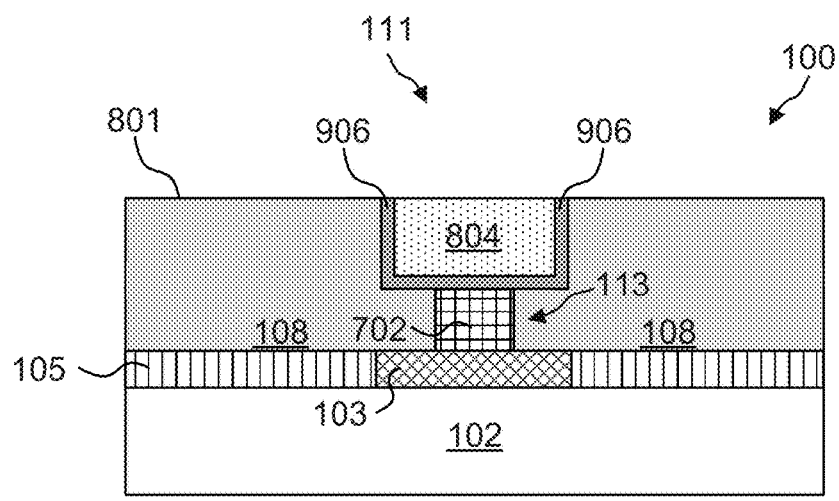
FIG. 9 is a cross-sectional view of a partially-fabricated semiconductor interconnect structure after annealing an amorphous carbon layer to form a graphed barrier layer, in accordance with some embodiments.

FIG. 9 is a cross-sectional view of a partially-fabricated semiconductor interconnect structure 100 after annealing an amorphous carbon layer to form a graphed barrier layer, in accordance with some embodiments of the present disclosure. As shown in FIG. 9, a graphed barrier layer 906 can be formed in the place of a carbon source, for example, the amorphous carbon layer 806, in accordance with some embodiments. The formation of graphed barrier layer 906 can be similar to the formation of graphed barrier layer 506 as described above with respect to FIGS. 5A-B. The metal surfaces of conductive layer 804 in contact with amorphous carbon layer 806 act as catalyst surfaces during the annealing process to induce graphitization of the amorphous carbon layers. The number of graphed layers or the thickness of graphed barrier layer 906 can be controlled by varying the thickness of the initially deposited amorphous carbon layer 806. In some embodiments, the graphed barrier layer can have a thickness less than 10 angstroms. In some embodiments, the amorphous carbon layer's thickness can be proportional to the graphed layer's thickness; for example, the thicknesses can be substantially similar. Both pre-fill layer 702 and conductive layer 804 can be electrically coupled to conductive interconnection layer 103 after the formation of graphed barrier layer 906. The planarization process of surface 801 can be performed before the annealing process as described with respect to FIG. 8, or performed after the formation of graphed barrier layer 906, in accordance with some embodiments. The annealing process can be similar to the annealing processes described above with reference to FIGS. 5A-5B.

Figure 10:
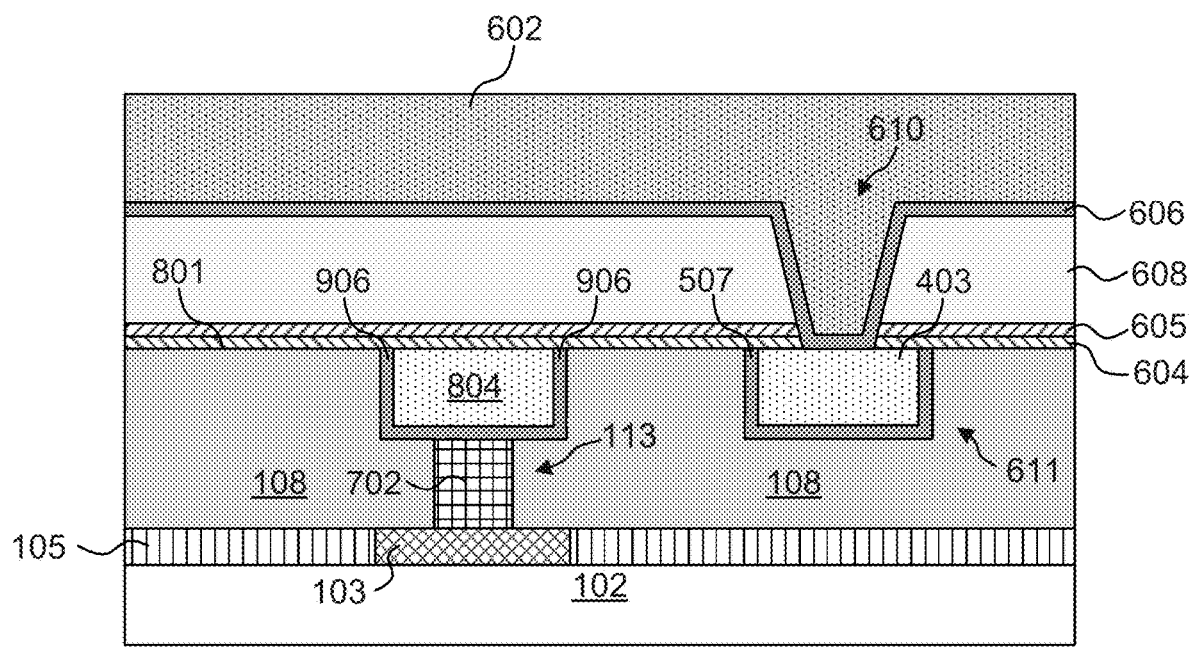
FIG. 10 is a cross-sectional view of partially-fabricated semiconductor interconnect structures illustrating multiple semiconductor layers and interconnect structures, in accordance with some embodiments.

FIG. 10 is a cross-sectional view of partially-fabricated semiconductor interconnect structures illustrating multiple semiconductor layers and interconnect structures, in accordance with some embodiments of the present disclosure. Similar to the structures described above with respect to FIG. 6, additional conductive and interconnect structures capped with graphed barrier layers can be incorporated or connected to semiconductor interconnect structure 100 of FIG. 9 to provide additional electrical connections. For example, conductive structure 611 can be formed in first dielectric layer 108 that includes a conductive layer 403 and a graphed barrier layer 507. Further, a second interconnect structure including conductive layer 602 and graphed barrier layer 606 can be formed in isolation layer 608 to provide electrical connection between conductive layer 602 and conductive layer 403 of conductive structure 600. In some embodiments, graphed barrier layer 606 can be formed by depositing an amorphous carbon layer on the exposed surfaces of isolation layer 608, depositing conductive layer 602, and annealing to form graphed barrier layer 606 using the method similar to the process as described above with respect to FIGS. 3-5. In some embodiments, the thicknesses of graphed barrier layers 906, 507, and 606 can be in a range of about 1 angstrom to about 300 angstroms.

Figure 11:
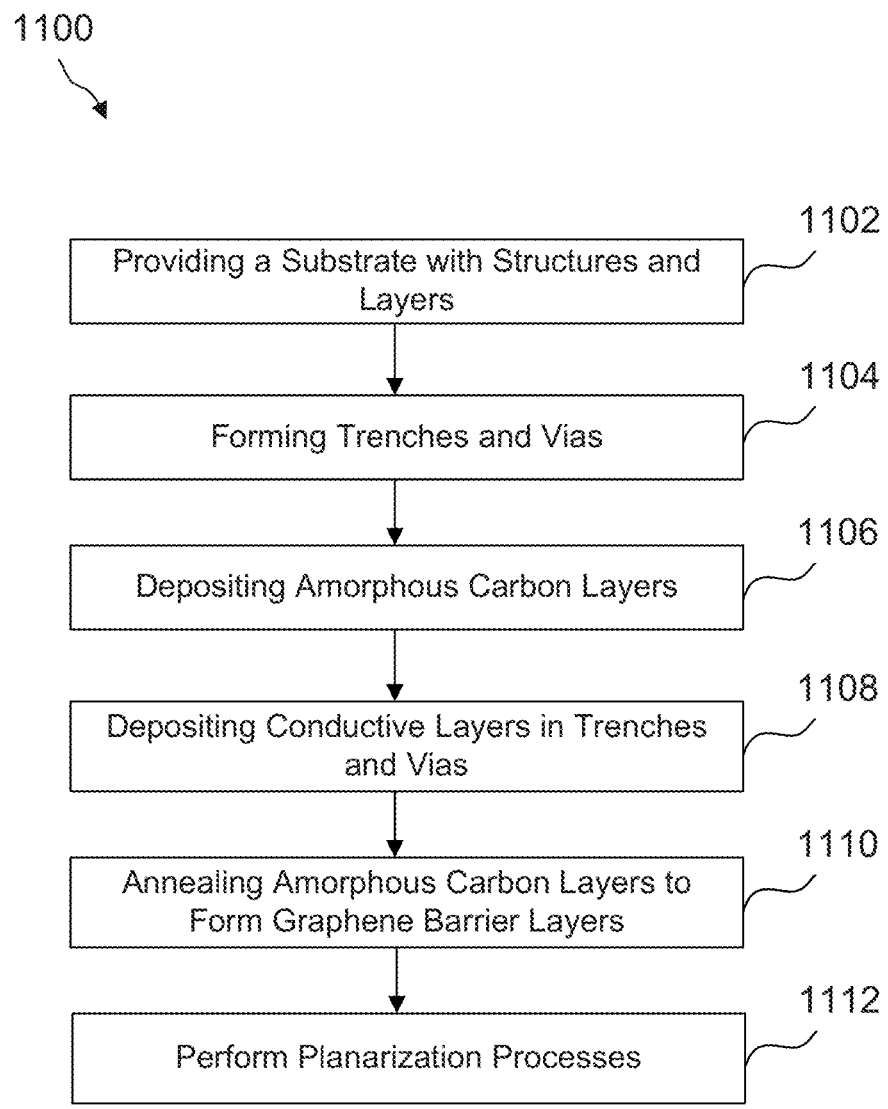
FIG. 11 is a flow diagram of an exemplary method of forming graphed barrier layers in semiconductor interconnect structures using amorphous carbon layers, in accordance with some embodiments.

FIG. 11 is a flow diagram of an exemplary method 1100 of forming graphed barrier layer using amorphous carbon layers and metal catalyst surfaces in semiconductor interconnect structures, in accordance with some embodiments of the present disclosure. Other operations in method 1100 can be performed. Further, operations of method 1100 can be performed in a different order and/or vary.

At operation 1102, structures and layers are formed on and/or within a semiconductor interconnect structure, in accordance with some embodiments. Examples of the substrate, conductive interconnection layer, conductive layers, and one or more dielectric layers are described above with respect to FIGS. 1A-1D. The semiconductor interconnect structure can include a substrate, a conductive interconnection layer, conductive layers, and one or more dielectric layers. The semiconductor structure can also include other layers as needed.

At operation 1104, trenches and vias are formed in the semiconductor interconnect structure, in accordance with some embodiments. The two patterning/etch steps can be performed in different orders, for example, in a (i) trench first then via order such as the process described above with respect to FIGS. 1A-1D; or (ii) via first then trench order such as the process described above with respect to FIGS. 2A-2D. The dual damascene process can also be a self-aligned dual damascene process using etch stop layers. The semiconductor interconnect structure can be used to connect metal lines of multilayers in semiconductor devices and formed using damascene, dual damascene, self-aligned dual damascene, and/or other suitable methods.

At operation 1106, amorphous carbon layers are deposited in the semiconductor interconnect structure, in accordance with some embodiments. An example of the forming amorphous carbon layer on the exposed surfaces of the dielectric layer is described above with respect to FIG. 3. The amorphous carbon layers can be deposited over exposed surfaces of the partially-fabricated semiconductor structure. The amorphous carbon layer can be deposited using any suitable processes such as, for example, spin-on, CVD, PECVD, ALD, PEALD, and/or other suitable processes. The processing temperature of the amorphous carbon layer can be in a range of about room temperature to about 1250° C. (e.g., between room temperature and 450° C.). A nominal thickness of the amorphous carbon layer can be in a range of about 1 angstrom to about 300 angstroms.

At operation 1108, conductive layers are deposited in trenches and vias of the semiconductor interconnect structure, in accordance with some embodiments. An example of the deposition of conductive layers in trenches and vias of the semiconductor interconnect structure is described above with respect to FIG. 4. Trenches and vias are filled with a conductive layer that is in contact with the amorphous carbon layer. The conductive layer formed in the trenches can be conductive lines that are electrically coupled to the conductive interconnection layer after the formation of graphed barrier layers. In some embodiments, the composition of the conductive layer includes suitable metals such as, for example, Ag, Al, Au, Cu, Ru, Co, Ni, W, Mn, Mo, CoW, CoWP, other suitable materials, and/or combinations thereof. The conductive layer can be deposited by any suitable filling processes such as, for example, CVD, PVD, ALD, MBE, HDPCVD, MOCVD, RPCVD, PECVD, plating, other suitable methods, and/or combinations thereof.

A via pre-fill process can be utilized to reduce voids formed within dual damascene metal layers such as, for example, vias of semiconductor interconnect structures. An example of the via pre-fill process is described above with respect to FIGS. 7-8. Prior to forming the conductive layer using an electrochemical plating process, a pre-fill layer can be selectively deposited to fill vias. In some embodiments, an amorphous carbon layer is deposited in the via and trenches prior to the deposition of the pre-fill layer. In some embodiments, an amorphous carbon layer is deposited in the trench after the pre-fill layer is deposited to fill the vias. A conductive layer is then deposited over the amorphous carbon layer to fill the trenches. The pre-fill layer and conductive layer can be either same or different materials.

At operation 1110, an annealing process is performed to form a graphed barrier layer in the semiconductor interconnect structure, in accordance with some embodiments. Examples of the annealing processes to form the graphed-based barrier layer in the semiconductor interconnect structure is described above with respect to FIGS. 5A-5B. In some embodiments, a graphed barrier layer can be formed in the place of a carbon source, for example, the amorphous carbon layer. The metal surfaces of the conductive layers that are in contact with the amorphous carbon layers act as catalyst surfaces during an annealing process to induce graphitization of the amorphous carbon layers. The graphitization process can include thermal dissociation of the amorphous carbon layer at elevated temperatures, diffusion of carbon atoms diffuse into the metal layer, precipitation of carbon clusters at place of the amorphous carbon layer, carbon-carbon coupling reactions of the carbon clusters to form graphed barrier layers. A dehydrogenation process can also assist in the formation of carbon clusters depending on the existence of catalyst reactants such as hydrogen or oxygen atoms. The graphed barrier layers can contain one or more graphed layers. The number of graphed layers or the thickness of the formed graphed barrier layer can be controlled by varying the thickness of the initially deposited amorphous carbon layer. Therefore, a wide range of graphed layer thickness can be achieved. For example, by choosing nominal amorphous carbon layer thicknesses in a range of about 1 angstrom to about 300 angstroms, the graphed layer thicknesses can be in a range of about 1 angstrom to about 300 angstroms. In some embodiments, the graphed barrier layer can have a thickness less than 10 angstroms. In some embodiments, the amorphous carbon layer's thickness can be proportional to the graphed layer's thickness, for example, the thicknesses can be substantially similar. The annealing temperature to induce graphitization can be in a range of about 250° C. to about 1250° C. (e.g., between 250° C. to 450° C.). The temperature for the annealing process can be, for example, 200° C., 300° C., 400° C., 500° C., or any other suitable temperature, in accordance with some embodiments. The annealing process can be done through multiple annealing steps at various temperatures, in accordance with some embodiments. The annealing process can include a pre-heating step, a stable heating step, a cooling step, and/or other suitable steps. The annealing process can be performed for different periods of time such as, for example, in a range of about 30 s to about 300 s, in accordance with some embodiments. The annealing time can be longer than 300 s if needed. The anneal process can include any suitable processes such as, for example, plasma heating, IR heating, lamp heating, traditional baking, other suitable annealing methods, and/or combinations thereof.

At operation 1112, the top surfaces of semiconductor interconnect structure can be planarized using suitable processes, in accordance with some embodiments. Examples of the planarization process are described above with respect to FIG. 8.

Various embodiments in accordance with this disclosure provides mechanisms of forming a graphed barrier layer by thermally annealing amorphous carbon layers on metal catalyst surfaces. To form graphed barrier layers, an amorphous carbon layer can be formed on the exposed surfaces of an opening in the semiconductor structure. A conductive metal layer is deposited in the opening and over the amorphous carbon layer. During an annealing process, carbon atoms in the amorphous carbon layer form carbon clusters at the metal/semiconductor interface through thermal dissociation and surface diffusion. The carbon clusters diffuse and collide at the interface to enable carbon-carbon coupling reactions and form graphed barrier layers. The graphed barrier layers can contain one or more graphed layers. The thin graphed formation maximizes the volume of the conductive material in the opening. As a result, the conductive metal layer is capped by the graphed barrier layers which avoids diffusion or oxidation of the conductive material and in turn prevents the formation of metal oxide in and around the conductive metal layer in semiconductor interconnect structures.

In accordance with various embodiments of this disclosure, using amorphous carbon layers to form graphed barrier layers in semiconductor interconnect structures provides, among other things, benefits of (i) low sheet resistance by utilizing the thin thickness of graphed layers and maximizing the volume of conductive material in interconnects structure; (ii) enhanced device reliability as graphed-based barrier layers inhibit diffusion and reaction between the layers that are in contact with the barrier layers; (iii) controllable thickness of graphed barrier layer by adjusting the thickness of the amorphous carbon layer; and (iv) improved device reliability due to chemical stability and reliability of graphed barrier layers.

In some embodiments, a semiconductor structure includes a substrate and a metal layer formed in the substrate. A dielectric layer can be formed over the metal layer and an opening is formed in the dielectric layer. The opening can expose surfaces of the dielectric layer and a portion of the metal layer. A graphed barrier layer can be formed on the exposed surfaces of the dielectric layer and the exposed portion of the metal layer. A conductive layer can be formed in the opening and on the graphed barrier layer.

In some embodiments, a semiconductor structure includes a conductive interconnect layer and a dielectric layer formed over the conductive interconnect layer. The semiconductor structure also includes a via-fill layer formed in the dielectric layer and in contact with a portion of the conductive interconnect layer. A trench-fill layer can be formed in the dielectric layer and over the via-fill layer. A graphed barrier layer can be formed between the via-fill layer and the trench-fill layer. The graphed barrier layer can also be formed between the trench-fill layer and the dielectric layer.

In some embodiments, a method of fabricating a semiconductor structure includes forming a dielectric layer over a metal layer and forming an opening in the dielectric layer. The opening exposes surfaces of the dielectric layer and a portion of the metal layer. An amorphous carbon layer can be formed on the exposed surfaces of the dielectric layer and the portion of the metal layer. A conductor material can be formed on the amorphous carbon layer. An anneal process can be performed on the semiconductor structure to graphitize the amorphous carbon layer and form a graphed barrier layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor structure, comprising:
   a substrate;
   a metal layer formed on the substrate;
   a dielectric layer formed on the metal layer;
   a first conductive layer formed in the dielectric layer and on a portion of the metal layer;
   a graphene barrier layer formed at least on side surfaces of the dielectric layer and on the first conductive layer; and
   a second conductive layer formed in the dielectric layer and on the graphene barrier layer.

2. The semiconductor structure of claim 1, wherein the graphene barrier layer has a thickness in a range of about 1 angstrom to about 300 angstroms.

3. The semiconductor structure of claim 1, wherein the graphene barrier layer comprises one or more layers of graphene.

4. The semiconductor structure of claim 1, wherein the first conductive layer is formed directly on the portion of the metal layer.

5. The semiconductor structure of claim 1, wherein the graphene barrier layer has a thickness in a range of less than 10 angstroms.

6. The semiconductor structure of claim 1, wherein at least a portion of the graphene barrier layer is between the first and second conductive layers.

7. The semiconductor structure of claim 1, wherein the first and second conductive layers comprise different materials.

8. The semiconductor structure of claim 1, wherein the first conductive layer comprises silver, aluminum, gold, copper, ruthenium, cobalt, nickel, tungsten, manganese, molybdenum, cobalt tungsten, cobalt tungsten phosphorous, or an alloy thereof.

9. The semiconductor structure of claim 6, wherein the first and second conductive layers are formed in a via and a trench, respectively.

10. The semiconductor structure of claim 1, wherein a top surface of the second conductive layer is coplanar with a top surface of the dielectric layer.

11. A semiconductor structure, comprising:
a conductive interconnect layer;
a dielectric layer formed over the conductive interconnect layer;
a first conductive layer formed in the dielectric layer and in contact with a portion of the conductive interconnect layer;
a second conductive layer formed in the dielectric layer and over the first conductive layer, the second conductive layer comprising at least one sidewall; and
a graphene barrier layer formed between the first and second conductive layers and between the at least one sidewall of the second conductive layer and the dielectric layer.

12. The semiconductor structure of claim 11, wherein the graphene barrier layer has a thickness less than about 10 angstroms.

13. The semiconductor structure of claim 11, wherein the graphene barrier layer has a thickness in a range of about 1 angstrom to about 300 angstroms.

14. The semiconductor structure of claim 11, wherein the second conductive layer comprises silver, aluminum, gold, copper, ruthenium, cobalt, nickel, tungsten, manganese, molybdenum, cobalt tungsten, cobalt tungsten phosphorous, or an alloy thereof.

15. The semiconductor structure of claim 11, wherein the graphene barrier layer comprises one or more layers of graphene.

16. A semiconductor interconnect structure, comprising:
a substrate;
a conductive interconnect layer on the substrate;
a patterned dielectric layer over the substrate and over a portion of the conductive interconnect layer, the patterned dielectric layer comprising a pair of opposing sidewall surfaces;
a first conductive layer on the conductive interconnect layer;
a graphene layer formed on the first conductive layer and on the pair of opposing sidewall surfaces of the patterned dielectric layer; and
a second conductive layer formed on the graphene layer, wherein at least a portion of the second conductive layer is between the pair of opposing sidewall surfaces of the patterned dielectric layer.

17. The semiconductor interconnect structure of claim 16, wherein the graphene layer has a thickness in a range of about 1 angstrom to about 300 angstroms.

18. The semiconductor interconnect structure of claim 16, wherein the first and second conductive layers are formed in a via and a trench, respectively.

19. The semiconductor interconnect structure of claim 16, wherein the patterned dielectric layer further comprises a top surface, and the least one portion of the second conductive layer is formed below the top surface of the patterned dielectric layer.

20. The semiconductor interconnect structure of claim 16, wherein the first and second conductive layers comprise different materials.

* * * * *